(12) United States Patent
Von Staudt et al.

(10) Patent No.: US 7,960,982 B2
(45) Date of Patent: Jun. 14, 2011

(54) SUPPLY CURRENT BASED TESTING OF CMOS OUTPUT STAGES

(75) Inventors: Hans Martin Von Staudt, Kingston Bagpuze (GB); Alan Somerville, New Castle Upon Tyne (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 433 days.

(21) Appl. No.: 12/074,081

(22) Filed: Feb. 29, 2008

(65) Prior Publication Data
US 2009/0212760 A1    Aug. 27, 2009

(30) Foreign Application Priority Data

Feb. 25, 2008    (EP) ..................................... 08368004

(51) Int. Cl.
*G01R 31/3187* (2006.01)
(52) U.S. Cl. ................................. 324/750.3; 324/762.01
(58) Field of Classification Search ........... 324/754–765
See application file for complete search history.

(56) References Cited

U.S. PATENT DOCUMENTS

| | | | |
|---|---|---|---|
| 6,262,585 B1 * | 7/2001 | Frodsham et al. | 324/763 |
| 6,593,765 B1 | 7/2003 | Ishida et al. | |
| 6,636,066 B2 * | 10/2003 | Shimoda | 324/765 |
| 6,725,171 B2 * | 4/2004 | Baur et al. | 702/117 |
| 6,774,656 B2 * | 8/2004 | Baur et al. | 324/765 |
| 6,788,095 B1 | 9/2004 | Mark et al. | |
| 6,847,203 B1 | 1/2005 | Conti et al. | |
| 6,982,555 B2 * | 1/2006 | Yamashita et al. | 324/519 |
| 7,443,186 B2 * | 10/2008 | Strid et al. | 324/763 |
| 2002/0079915 A1 | 6/2002 | Baur et al. | |
| 2005/0024075 A1 | 2/2005 | Srivastava | |
| 2006/0232289 A1 * | 10/2006 | Plangger et al. | 324/763 |
| 2006/0248416 A1 | 11/2006 | Furukawa | |
| 2006/0273820 A1 * | 12/2006 | Arnold et al. | 326/16 |
| 2007/0208526 A1 | 9/2007 | Staudt et al. | |

FOREIGN PATENT DOCUMENTS

| | | |
|---|---|---|
| EP | 0 664 512 A1 | 7/1995 |
| EP | 08368004.1-2216 | 7/2008 |

\* cited by examiner

*Primary Examiner* — Ha Tran T Nguyen
*Assistant Examiner* — Richard Isla Rodas
(74) *Attorney, Agent, or Firm* — Saile Ackerman LLC; Stephen B. Ackerman

(57) ABSTRACT

A CMOS driver test configuration, which allows both leakage current and load current testing, using a single monitor, or current meter, located in a power lead of a tester connected to a power pad servicing the driver circuits. Both leakage testing and load current testing for CMOS drivers is described. The test configuration allows a plurality of driver circuits connected in parallel between power pads to be tested simultaneously. An ESD device, internal to the chip, is used as a load during load current testing in chip testing, and an external load is used during package testing in order to include the bonding means between the chip output pad of the driver and the package I/O pin in the current path during load current testing.

15 Claims, 2 Drawing Sheets

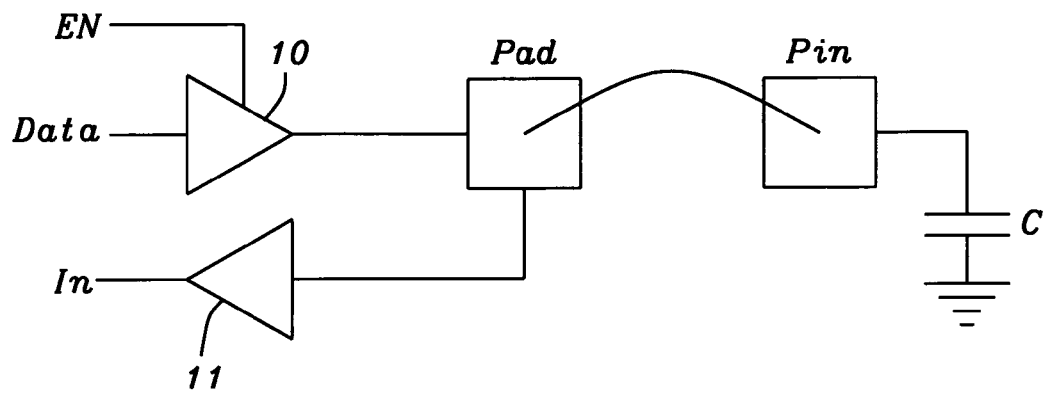
*FIG. 1 – Prior Art*
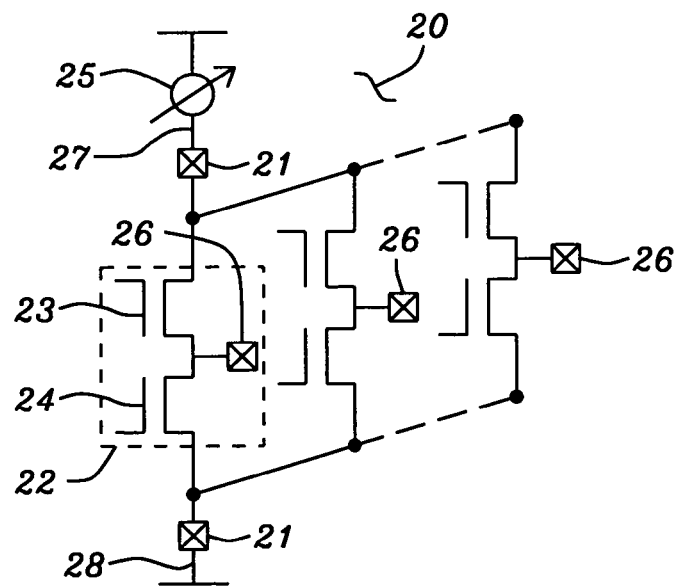
*FIG. 2*

SUPPLY CURRENT BASED TESTING OF CMOS OUTPUT STAGES

BACKGROUND OF THE INVENTION

1. Field of Invention

The present invention is related to testing semiconductor integrated circuit chip and in particular the testing of CMOS driver circuits.

2. Description of Related Art

The evolution of integrated circuit chips has resulted in chips with a higher density of circuits, more I/O pads and a larger variety of functions. Testing these chips has required testers with many expensive pin electronics to allow the testing of a large variety of chips where input pin on one chip is an output pin on another chip. Further complicating the requirements of an output pin is that the driver may be relatively low or high power. Also the driver may operate at a relatively low or high voltage. The driver may be single ended or biased between two voltages. Thus the cost of the pin electronics increases as a tester accommodates the variety of possible configurations. Further as the complexity of the tester increases, the amount of testing devices in parallel becomes limited.

High pin count SOC (system on chip) devices and in particular those with a high number of output drivers can benefit from a test technique utilizing a subset of I/O pins or pads. This would reduce the number of connections to be made, lowering the cost of probe cards, or sockets, ease the control of the contacting process. A lower pin count test might leave out DC performance of unconnected pins/pads, which could be acceptable where a second final test after packaging is performed, but is not acceptable for single test insertion devices that are delivered as tested.

U.S. Pat. No. 6,725,171 (Baur et al.) is directed to bi-directional I/O that takes advantage of the of the ability to use a complimentary device to serve as a load for the transistor under test and cause a voltage drop that is accessed by the input circuit and converted to a digital signal. US 2007/0208526 is directed to reconfiguring a load transistor in to a current mirror and to provide the mirror current available for comparison or direct measurement. U.S. Pat. No. 6,593,765 (Ishida et al.) is directed to a testing apparatus in which test patterns are applied to an integrated circuit chip to activate a circuit path, wherein measurements of chip power supply transient current is used to detect a fault in the activated circuit path. U.S. Pat. No. 6,847,203 (Conti et al.) is directed to an integrated circuit chip apparatus that has contact pads to make contact with signal input/output pins of the chip being tested. An intermediate banking box is used that reduces the number of tester channels connected to the integrated circuit chip.

FIG. 1 displays another method to determine drive capability of an output driver of an integrated circuit chip without the use of instrumentation in the pin electronics of a tester. A capacitor C on a load board is connect to a chip pad connected to a bidirectional I/O circuit where data loaded into the driver is enabled EN and the time constant of the output driver 10 driving the capacitor C is measured by the receiver circuit 11.

Many of the tricks to reduce the need of expensive pin electronics in a tester revolve around bidirectional I/O where the input circuit is used to measure the response of the output circuit to a test procedure. When the bidirectional capability does not exist at a chip output pad, as is the case for high voltage drivers, other techniques need to be used.

SUMMARY OF THE INVENTION

It is an objective of the present invention to measure the drive current capability of a CMOS driver with a current monitor circuit located in a power lead of a tester connected to a power pad of the CMOS driver.

It is further an objective of the present invention to measure separately the current carrying capability of PMOS and NMOS transistors that constitute a push-pull type CMOS output driver.

It is also an objective of the present invention to measure leakage current of the CMOS output driver using a current monitor located in the power lead of the tester that is connected to the chip power pad connected to the output driver.

It is still further an objective of the present invention to use ESD (electrostatic discharge) devices to load down each driver transistor and provide a path for current flowing through the output transistor being tested.

It is also further and objective of the present invention to provide load devices connected to the driver output pad to facilitate a current test of each driver transistor.

In the present invention an output driver circuit comprising of a PMOS transistor connected in series with an NMOS transistor and forming an output wherein the PMOS and NMOS transistor are connected in series between two power pads. Paralleling each driver transistor is a selectable ESD device. When the PMOS transistor is selected for test, the ESD device paralleling the NMOS device is selected completing the current path between the two power pads. When the NMOS transistor is selected for test, the ESD device paralleling the PMOS device is selected completing the current path between the two power pads.

Current measurement is performed by a current monitor located in a power lead of the tester that is connected to a power pad of the chip containing the CMOS driver under test. It is most beneficial for the accuracy of the current test of the present invention that the power pads of the CMOS chip be segregated from power pads of the rest of the circuitry of the CMOS chip; however, it is within the scope of the present invention that the power distribution is common on the CMOS chip where a difference in power current before and after activating a power transistor is used to obtain a value of the output transistor current.

A Leakage current is measured through one or more driver circuits connected between the power pads of the CMOS chip by the current monitor located in the power lead of the tester. All the PMOS transistors of the CMOS driver circuits connected between the power pads are selected and the leakage current through the NMOS transistors is measured by the current monitor circuit located in the tester power lead connecting to a power pad of the chip. Then all NMOS transistors of the driver circuits are selected and the leakage current through the PMOS transistors of the driver circuits is measure.

BRIEF DESCRIPTION OF THE DRAWINGS

This invention will be described with reference to the accompanying drawings, wherein:

FIG. 1 is a circuit diagram of prior art showing the use of a capacitor to measure current drive capability by means of the charging time of the capacitor;

FIG. 2 is a circuit diagram of the present invention for measuring leakage current of CMOS driver circuit transistors;

DETAILED DESCRIPTION OF THE PREFERRED EMBODIMENT

Figure 3:
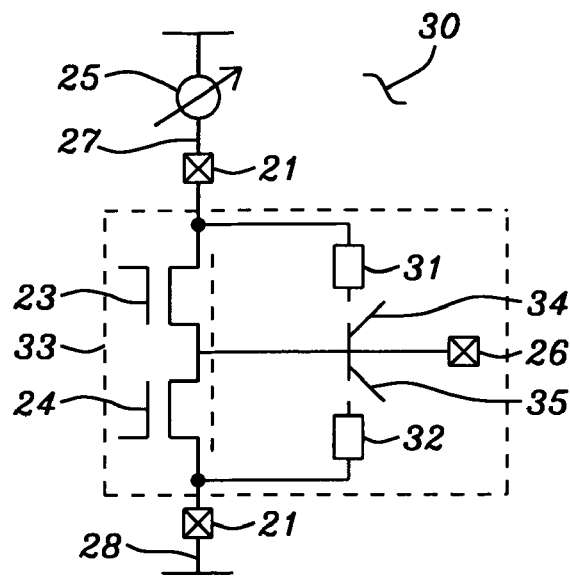
FIG. 3 is a circuit diagram of the present invention for measuring load current handling capability of transistors forming CMOS driver circuits and using ESD devices as loads.

In FIG. 2 is shown a circuit diagram 20 for leakage testing of transistors forming CMOS driver circuits. Connected between power pads 21 of a semiconductor chip is a plurality of driver circuits 22 connected in parallel. The CMOS driver circuits are formed by a PMOS transistor 23 connected to an NMOS transistor 24 where the connection of the PMOS transistor to the NMOS transistor forms an output connected to an output pad 26 of the chip. A current monitor, or meter, 25 is located in the tester and is connected to a power lead that connects the tester to the chip under test. The current monitor 25 can be located in the tester within either the high voltage power lead 27 or the low voltage power lead 28.

To measure leakage current, all of the PMOS transistors 23 of the driver circuits connected between the power pads 21 are selected (turned on), and the current monitor 25 measures the leakage current through the NMOS transistors. Then the NMOS transistors 24 are selected (PMOS transistors not selected), and the current monitor 25 measures the leakage current through the PMOS transistors 23. It should be noted that it is within the scope of the present invention that the number of NMOS or PMOS transistors that are selected in the leakage current test can be fewer than maximum number of driver circuits connected between the power pads 21, where a fewer than the maximum number of PMOS driver transistors are selected and a fewer than the maximum number of NMOS driver transistors are measured for leakage current, and where a fewer than the maximum number of NMOS driver transistors are selected and a fewer than the maximum of PMOS driver transistors are measured for leakage current. The minimum number of driver transistors tested in parallel for leakage current may be limited by monitor resolution, test tolerances and guard bands.

FIG. 3 shows a circuit diagram 30 of the present invention to measure drive current capability of a CMOS driver circuit. Connected between power pads 21 of a semiconductor chip is a driver circuit 33, which may be connected in parallel with additional driver circuits 33 between the power pads 21. The CMOS driver circuits are formed by a PMOS transistor 23 connected to an NMOS transistor 24 where the connection of the PMOS transistor to the NMOS transistor forms an output connected to an output pad 26 of the chip. A current monitor, or meter, 25 located in the tester is connected to a power lead that connects the tester to the chip under test. The current monitor 25 may be located in either the high voltage power lead 27 of the tester, or the low voltage power lead 28 of the tester. A selectable ESD device 31 is connected in parallel to the PMOS transistor 23, and a selectable ESD device 32 is connected in parallel to the NMOS transistor 24. The selectability the ESD devices 31 and 32 are diagrammatically represented by switches 34 and 35, respectively. The ESD devices 31 and 32 provide loads that complete the current path for testing the drive current of the PMOS and NMOS transistors of the CMOS driver. In lieu of using a selectable ESD device as load 31 and 32 for the load current test, other devices can be used comprising an external load, a complimentary transistor, and a portion of a complimentary transistor.

To test the PMOS transistor, the PMOS transistor 23 is selected and the ESD device 32 paralleling the NMOS transistor is selected allowing current flow from the tester. The current is measured with the current monitor, or meter, 25 located in the tester. The NMOS transistor 22 is tested for load current capability by selecting the NMOS transistor 24 and selecting the ESD device 31 that parallels the PMOS transistor. Current flow through the NMOS transistor 24 and the ESD device 31 is measured with the current monitor 25 located in the tester.

It should be noted that it is within the scope of the present invention to measure load current capability of a plurality of CMOS drivers 22 simultaneously connected in parallel between the power pads 21, which is limited by the acceptable test tolerance and guard bands.

Figure 4:
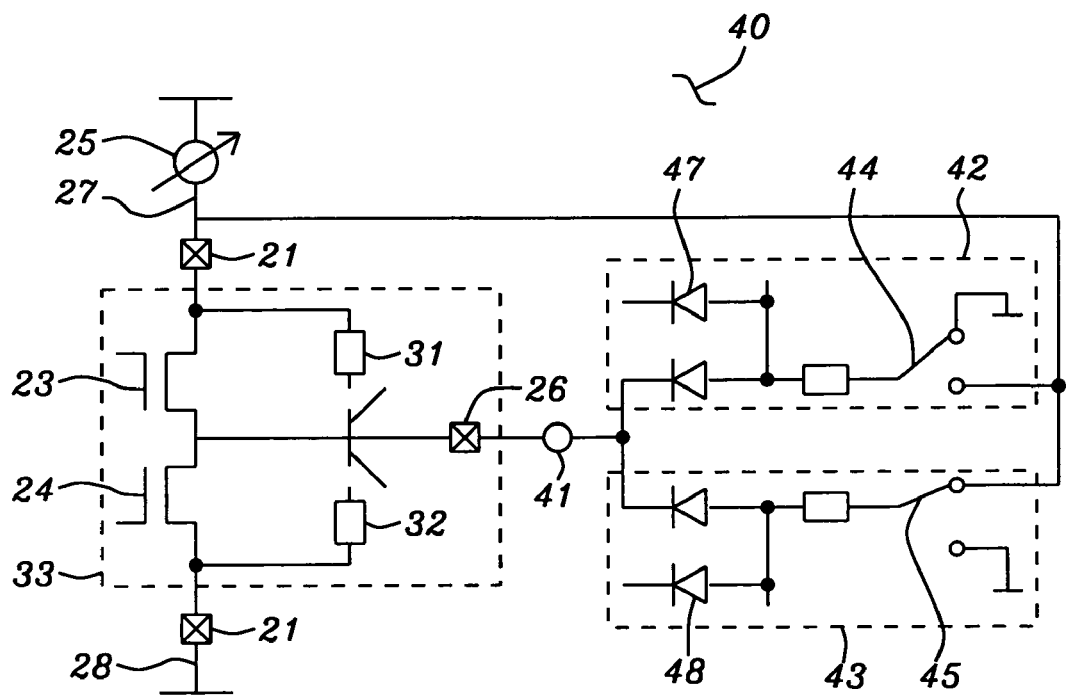
FIG. 4 is a circuit diagram of the present invention for measuring load current handling capability of transistors forming CMOS driver circuits and using externally connected loads.

FIG. 4 shows a circuit diagram 40 of the present invention for testing the load current of CMOS driver circuit 33 using external loads 42 and 43. Whereas the circuit configuration shown in FIG. 4 could be used for chip testing, the intended purpose is for package testing so as to include the bonding means that connects the chip pad 26 to the package I/O pin 41. When the PMOS transistor 23 is selected, the switch 45 within the external load device 43 is connected to a low voltage 46 to pull load current through the chip pad 26 and the package I/O 41 to include the bonding means of the chip to the package into the load current test. When the NMOS transistor 24 is selected the switch 44 within the external load device 42 is connected to the tester power lead containing the current monitor circuit to allow load current to flow through the package pin 41 and the chip I/O pad 26 through the NMOS transistor 24. The external load devices 42 and 43 are connected by switches 44 and 45 to voltages that back bias the diodes 47 and 48 and remove the load devices from the conducting circuitry. Further, it should be noted that it is within the scope of the present invention to measure load current capability of a plurality of CMOS drivers 22 simultaneously connected in parallel between the power pads 21 and is limited by the acceptable test tolerance and guard bands.

If a chip contains on-chip switch-able loads 31 or 32 it is sufficient to connect only one type of external load 42 or 43, thus greatly reducing the amount of external components. Also, it should be understood that the test configuration, methods and techniques described herein are applicable to semiconductor technologies other than CMOS technology, which comprises bipolar technology and bipolar drivers.

While the invention has been particularly shown and described with reference to preferred embodiments thereof, it will be understood by those skilled in the art that various changes in form and details may be made without departing from the spirit and scope of the invention.

What is claimed is:
1. A method of current testing semiconductor drivers; comprising:
a) forming driver circuits on a semiconductor device, comprising CMOS circuits, each driver circuit comprising an NMOS transistor connected in series with a PMOS transistor between a first and a second power supply pad of said semiconductor device;
b) connecting a tester to said semiconductor device, whereby a first power supply lead of said tester is connected to the first power pad and a second power supply lead of said tester is connected to the second power pad, wherein current flow to said driver circuits is measured by a current monitor located in said first power supply lead;

c) selecting the NMOS transistor, selecting a first load device in parallel with said PMOS transistor and measuring current flow through said NMOS transistor with said current monitor; and d) selecting the PMOS transistor, selecting a second load device in parallel with said NMOS transistor and measuring current flow through said PMOS transistor with said current monitor.

2. The method of claim 1, wherein the load device is an ESD (electro-static discharge) device located on the semiconductor device.

3. The method of claim 1, wherein said first and second load devices are external to the semiconductor device and coupled by the tester to an output of the driver circuits.

4. The method of claim 1, wherein said NMOS transistors of all driver circuits connected between the power supply pads are selected and leakage current through the PMOS transistors of the driver circuits is measured by said current monitor, then said PMOS transistors of all driver circuits are selected and leakage current through the NMOS transistors is measured by said current monitor.

5. The method of claim 4, wherein said leakage current is measured for fewer than all driver circuits connected between the first and second power supply pads by selecting fewer than all the NMOS transistors to measure leakage current through the PMOS transistors and selecting fewer than all the PMOS transistors to measure leakage current through the NMOS transistors.

6. The method of claim 1, wherein the first and second supply pads are exclusively used for the driver circuits.

7. A circuit to test current of CMOS driver circuits, comprising:

a) a plurality of CMOS driver circuits, each comprising a PMOS transistor connected to an NMOS transistor to form an output and further said plurality of CMOS driver circuits connected between a first and second power pad of an integrated circuit chip;

b) a first ESD (electro-static discharge) device select-ably connected between a source and drain of the PMOS transistor;

c) a second ESD device select-ably connected between the source and drain of the NMOS transistor;

d) a first tester lead of a tester connected to the first power pad and further comprising a current monitor circuit to measure current;

e) a second tester lead of said tester connected to the second power pad;

f) said NMOS transistor and said first ESD device selected to measure current through the NMOS device using said current monitor circuit; and g) said PMOS transistor and said second ESD device selected to measure current through the PMOS transistor using said current monitor circuit.

8. The circuit of claim 7, wherein the first and second power pads are exclusively used for a plurality of said CMOS driver circuits.

9. The circuit of claim 7, wherein said current monitor circuit measures a collective leakage current through all CMOS driver circuits connected between the first and second power pads when the first and second ESD devices are not selected, and wherein all the PMOS transistors are selected to measure leakage current collectively through all the NMOS transistors and wherein all the NMOS transistors are selected to measure leakage current collectively through all the PMOS transistors.

10. The circuit configuration of claim 9, wherein said current monitor circuit measures collective leakage current through fewer than all CMOS driver circuits connected between the first and second power pads whereby fewer than all PMOS transistors are selected to measure leakage current through fewer than all NMOS transistors, and whereby fewer than all NMOS transistors are selected to measure leakage current through fewer than all PMOS transistors.

11. The circuit of claim 7, wherein said current measurement is performed with a selectable load in said tester that is connected to said output of the CMOS driver circuits.

12. A CMOS driver current measurement circuit, comprising:

a) means for forming on an integrated circuit chip a plurality of CMOS drivers between first and second power pads, wherein each of the CMOS drivers further comprises an NMOS transistor, a PMOS transistor and a driver output terminal;

b) a means for powering said plurality of CMOS drivers comprising a tester, wherein the first and second power pads are connected to said tester;

c) a means for said tester to measure current flowing from the tester to said plurality of CMOS drivers;

d) a means for selecting the PMOS transistor and a first load device to allow current to flow through the PMOS transistor, wherein said first load device is a first ESD (electro-static discharge) device located on the integrated circuit chip and connected in parallel with the NMOS transistor; and e) a means for selecting the NMOS transistor and a second load device to allow current to flow through the NMOS transistor, wherein said second load device is a second ESD (electro-static discharge) device located on the integrated circuit chip and connected in parallel with the PMOS transistor.

13. The circuit of claim 12, wherein said first and second power pads are exclusively connected to the plurality of said CMOS drivers.

14. The circuit of claim 13, wherein said means for said tester to measure current flowing from the tester to said CMOS driver measures leakage current through the plurality of CMOS drivers connected between the first and second power pads, wherein all said PMOS transistors of the plurality of the CMOS drivers are selected and leakage current through said NMOS transistors is measured by a current monitor located in the tester, and wherein all said NMOS transistors are selected and leakage current through said PMOS transistors is measured by said current monitor.

15. The circuit of claim 13, wherein said means for said tester to measure current flowing from the tester to said CMOS driver measures leakage current through fewer than all of said plurality of the CMOS drivers, wherein the PMOS transistors of fewer than all of said plurality of the CMOS drivers are selected and leakage current through the NMOS transistors of fewer than all of said plurality of CMOS drivers is measured by said current monitor, and wherein the NMOS transistors of fewer than all of said plurality of the CMOS drivers are selected and leakage current through the PMOS transistors of fewer than all of said plurality of CMOS drivers is measured by said current monitor.

* * * * *

UNITED STATES PATENT AND TRADEMARK OFFICE
CERTIFICATE OF CORRECTION

| | | |
|---|---|---|
| PATENT NO. | : 7,960,982 B2 | |
| APPLICATION NO. | : 12/074081 | |
| DATED | : June 14, 2011 | |
| INVENTOR(S) | : Hans Martin von Staudt and Alan Somerville | |

It is certified that error appears in the above-identified patent and that said Letters Patent is hereby corrected as shown below:

Title Page;
In the Inventors (75), delete "Hans Martin Von Staudt, Kingston Bagpupze (GB)" and replace with
-- Hans Martin von Staudt, Oxfordshire (GB) --.

Signed and Sealed this
Sixth Day of March, 2012

David J. Kappos
*Director of the United States Patent and Trademark Office*